United States Patent
Liao

(10) Patent No.: US 7,196,419 B2
(45) Date of Patent: Mar. 27, 2007

(54) TRANSPORT SPEED MONITORING APPARATUS AND SEMICONDUCTOR PROCESSING SYSTEM UTILIZING THE SAME

(75) Inventor: Chi-Min Liao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 239 days.

(21) Appl. No.: 10/838,424

(22) Filed: May 4, 2004

(65) Prior Publication Data

US 2005/0282298 A1 Dec. 22, 2005

(51) Int. Cl.
*H01L 23/34* (2006.01)

(52) U.S. Cl. ...................... 257/728; 414/935
(58) Field of Classification Search ............... 438/14; 414/222.11, 222.13, 749.3, 935; 257/728
See application file for complete search history.

(56) References Cited

U.S. PATENT DOCUMENTS

| 4,624,638 | A | 11/1986 | Sarkozy ...................... 432/253 |
| 4,721,424 | A | 1/1988 | Aldridge et al. ............ 414/182 |
| 6,537,010 | B2 | 3/2003 | Martin et al. ................ 414/156 |
| 6,927,181 | B2 * | 8/2005 | Wakizako et al. ........... 438/782 |
| 6,938,505 | B2 * | 9/2005 | Chen et al. ................. 73/865.9 |
| 2004/0062633 | A1 * | 4/2004 | Rice et al. .................. 414/935 |

* cited by examiner

*Primary Examiner*—Brook Kebede
*Assistant Examiner*—Khiem Nguyen
(74) *Attorney, Agent, or Firm*—Thomas, Kayden, Horstemeyer & Risley

(57) ABSTRACT

A semiconductor processing system utilizing transport speed monitoring of a wafer boat. The semiconductor processing comprises a process chamber, loading device, and transport speed monitoring device. The loading device transports a boat of wafers into and out of the process chamber where the wafers experience particular treatment. The transport speed monitoring device is responsible for detecting the movement of the wafer boat and asserting an abnormality signal when the transport speed of the wafer boat falls beyond a limit.

3 Claims, 6 Drawing Sheets

TRANSPORT SPEED MONITORING APPARATUS AND SEMICONDUCTOR PROCESSING SYSTEM UTILIZING THE SAME

BACKGROUND

The invention relates to the field of semiconductor manufacturing equipment, and more particularly to a mechanism for monitoring the speed of wafer transport to and from a semiconductor processing furnace.

Semiconductor circuit components are normally produced by slicing an ingot of semiconductor material into thin wafers, each of which are then processed to produce many individual integrated circuits. One of these processing steps involves introducing the wafers into a high temperature furnace to effect thermal oxidation, diffusion, chemical vapor deposition (CVD), annealing, etc. For the purpose of batch processing, the wafers to be processed are typically loaded onto a quartz support structure commonly called a boat. A boat loader coupled to the furnace is operative to insert a boatload of wafers into the furnace for heat treatment and remove them therefrom after processing.

Boat loaders for semiconductor processing furnaces have been the subject of several United States patents, such as U.S. Pat. No. 4,624,638, U.S. Pat. No. 4,721,424, and U.S. Pat. No. 6,537,010. Although boat loading systems have been known to those skilled in the art for many years, none has addressed the need for real-time speed monitoring in the transport of a wafer boat. A loaded wafer boat being transported must move as steadily as possible to ensure the safety of the very valuable work product, i.e., the partially processed semiconductor wafers. Without real-time speed monitoring, for example, there is a possibility that a wafer boat can collide with a furnace tube cap due to an unexpected burst of movement. Such accidents can destroy or seriously damage the in-process wafers. Furthermore, the loading and treatment of wafers are highly automated in batch type processes. The transport speed of wafers can influence effective wafer process time accordingly. Under-speed or over-speed transport of wafers may result in excess or insufficient process time, which in turn leads to a poor yield rate. Therefore, what is needed is a real-time mechanism for monitoring the speed of loaded wafer boat transport to and from a semiconductor processing furnace. It is also desirable to protect the costly wafers from damage resulting from abnormalities including under-speed and over-speed problems.

SUMMARY

The present invention is generally directed to a semiconductor processing system and method. According to one aspect of the invention, the semiconductor processing system comprises a process chamber, loading device, and transport speed monitoring device. The loading device transports at least one wafer into and out of the process chamber in which the wafer are processed. The transport speed monitoring device is responsible for detecting the movement of the wafer and asserting an abnormality signal when the transport speed of the wafer falls beyond a limit.

According to another aspect of the invention, a wafer boat loading system having a transport speed monitoring apparatus is disclosed. The speed of a loaded wafer boat being conveyed to and from a furnace can be monitored with the transport speed monitoring apparatus. The transport speed monitoring apparatus is made up of a sensor, under-speed and over-speed detection units, first and second comparators, a sampling unit, and a switching unit. The sensor detects the movement of the loaded wafer boat and thereby generates an input signal having a frequency proportional to the speed of the loaded wafer boat. The under-speed detection unit is coupled to the sensor to receive the input signal. When the frequency of the input signal falls below a lower limit, the under-speed detection unit generates a first detection voltage exceeding a predetermined threshold voltage. Coupled to the under-speed detection unit, the first comparator compares the first detection voltage with the predetermined threshold voltage. When the first detection voltage exceeds the predetermined threshold voltage, an under-speed signal is asserted by the first comparator. The over-speed detection unit is also coupled to the sensor to receive the input signal. When the frequency of the input signal exceeds an upper limit, the over-speed detection unit generates a second detection voltage exceeding the predetermined threshold voltage. Coupled to the over-speed detection unit, the second comparator compares the second detection voltage with the predetermined threshold voltage. When the second detection voltage exceeds the predetermined threshold voltage, an over-speed signal is asserted by the second comparator. Additionally, the sampling unit is coupled to a driver by which the loaded wafer boat is conveyed and acquires a voltage signal from the driver and then amplifies this signal. The switching unit is coupled between the sampling and the under-speed detection units as well as between the sampling unit and the over-speed detection unit. In response to the presence of the amplified voltage signal, the switching unit is activated, thus starting the under-speed detection and the over-speed detection units.

According to yet another aspect of the invention, a transport speed monitoring apparatus comprises a sensor, an abnormality detection circuit, a comparator circuit, a sampling unit, and a switching unit. The sensor detects the movement of an article being transported and thereby generates an input signal having a frequency proportional to the speed of the article. The abnormality detection circuit receives the input signal from the sensor. Once the frequency of the input signal falls beyond a predefined range, the abnormality detection circuit generates a detection voltage exceeding a predetermined threshold voltage. Comparing the detection voltage with the predetermined threshold voltage, the comparator circuit asserts an abnormality signal when the detection voltage exceeds the predetermined threshold voltage. The sampling unit is coupled to a driver by which the article is transported and acquires a voltage signal from the driver and then amplifies this signal. Coupled between the sampling and the abnormality detection units, the switching unit is activated in response to the presence of the amplified voltage signal, thus starting the abnormality detection unit.

According to yet another aspect of the invention, a semiconductor processing method is set forth. To begin with, at least one wafer is transported to a process chamber, and meanwhile a transport speed monitoring procedure is performed. The monitoring procedure comprises: detecting the movement of the wafer and asserting an abnormality signal when the speed of the wafer falls beyond a limit. If the abnormality signal is not asserted during the transportation, the wafer can be processed in the chamber. Otherwise, an emergency procedure is launched in response to the assertion of the abnormality signal.

BRIEF DESCRIPTION OF THE DRAWINGS

The present invention will be described by way of exemplary embodiments, but not limitations, illustrated in the accompanying drawings in which like references denote similar elements, and in which.

DESCRIPTION

Reference throughout this specification to "one embodiment" or "an embodiment" indicates that a particular feature, structure, or characteristic described in connection with the embodiments is included in at least one embodiment of the present invention. Thus, the appearances of the phrase "in one embodiment" or "an embodiment" in various places throughout this specification are not necessary all referring to the same embodiment. Furthermore, the particular features, structures, or characteristics may be combined in one or more embodiments. The exemplary embodiments are described primarily with reference to block diagrams and flowcharts. As to the flowcharts, each block therein represents both a method step and an apparatus element for performing the method step. Herein, the apparatus element may be referred to as a means for, an element for, or a unit for performing the method step. Depending upon the implementation, the apparatus element, or portions thereof, may be configured in hardware, software, firmware or combinations thereof. As to the block diagrams, it should be appreciated that not all components necessary for a complete implementation of a practical system are illustrated or described in detail. Rather, only those components necessary for a thorough understanding of the invention are illustrated and described. Furthermore, components which are either conventional or may be readily designed and fabricated in accordance with the teachings provided herein are not described in detail.

Figure 1:
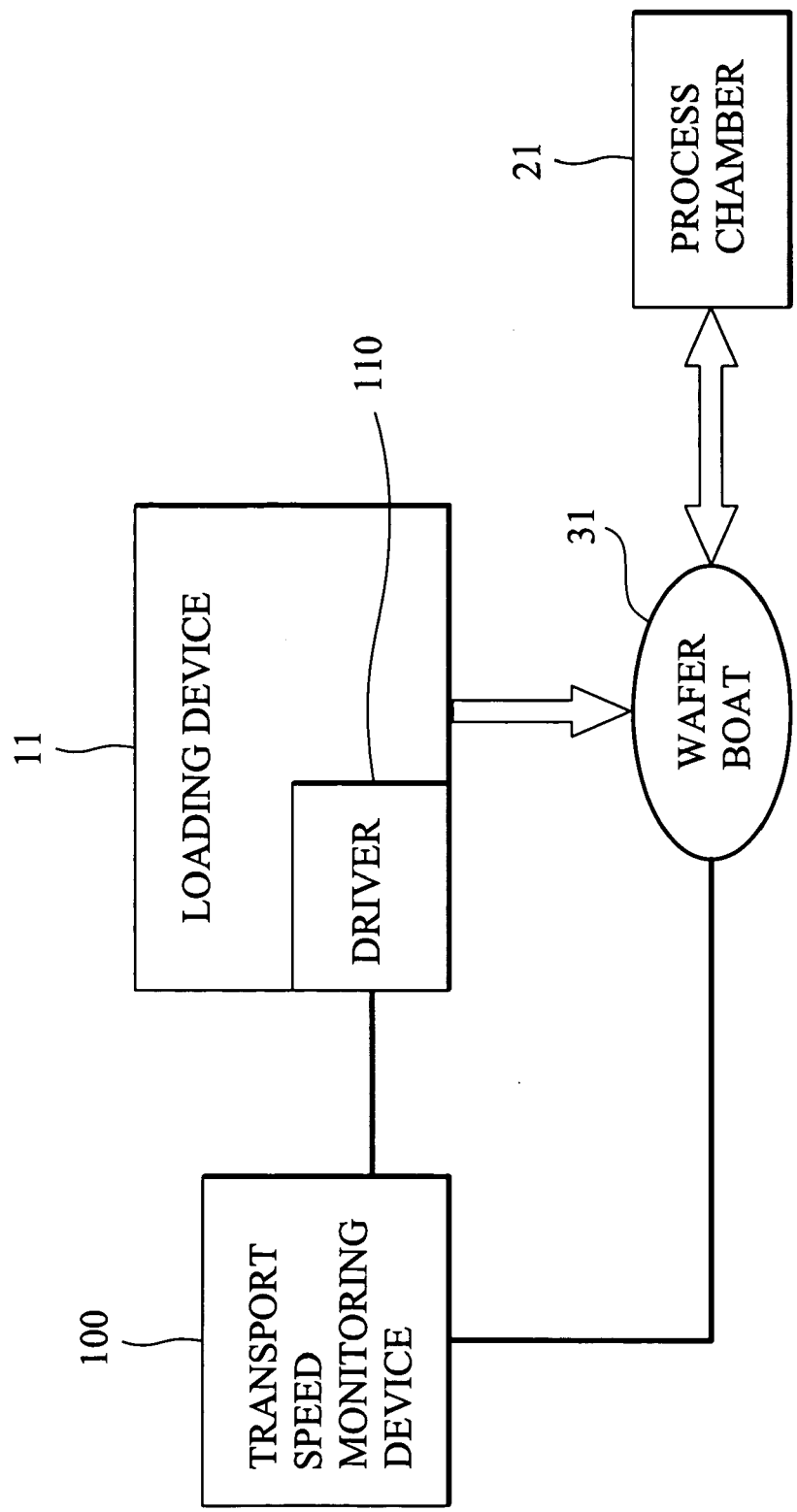
FIG. 1 is a functional block diagram of a semiconductor processing system according to an embodiment of the invention.
Figure 2:
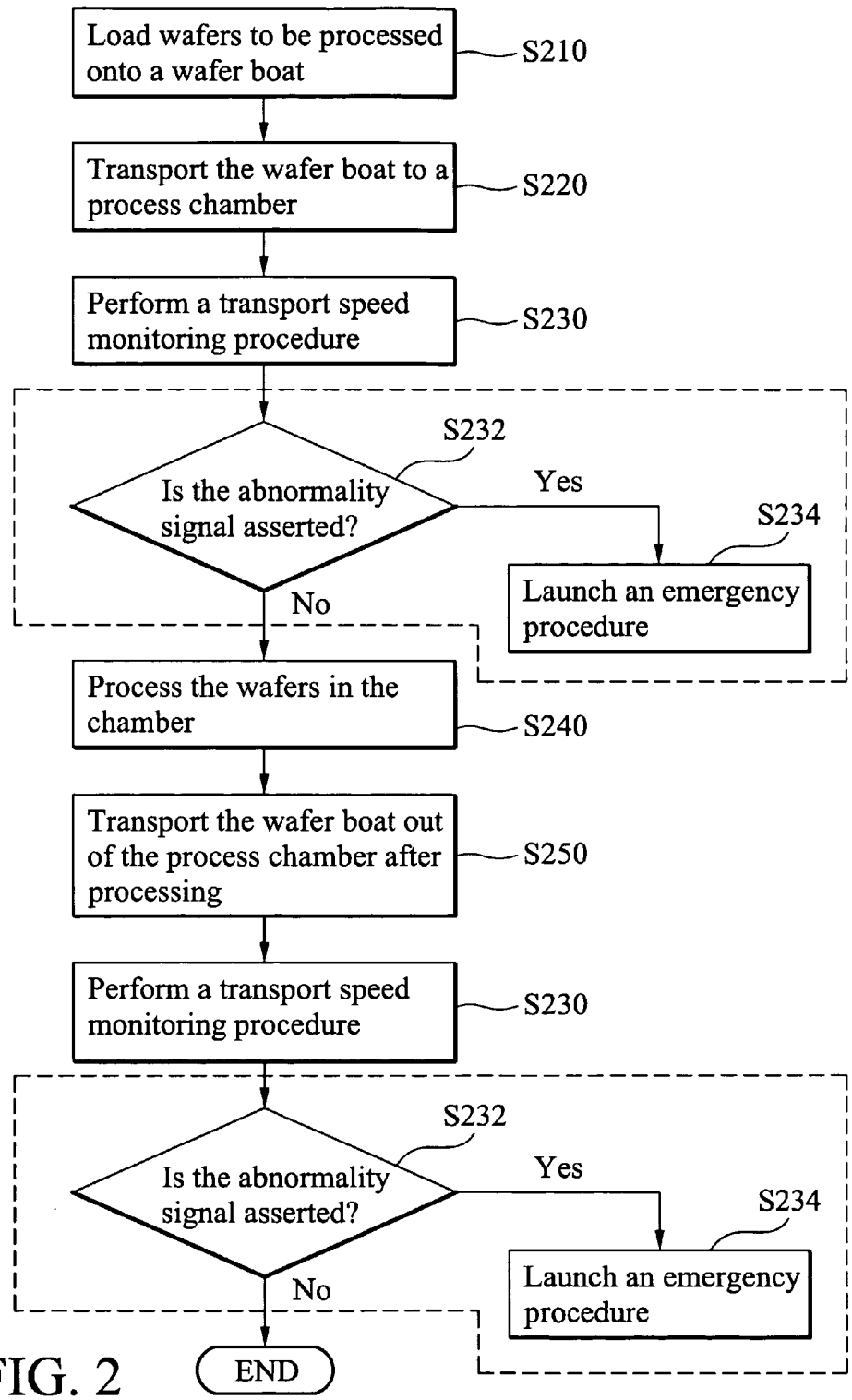
FIG. 2 is a flowchart illustrating primary operations of the semiconductor processing system according to an embodiment of the invention.

FIG. 1 is a simplified block diagram of a semiconductor processing system 11 according to an embodiment of the invention. The semiconductor processing system 11 mainly comprises a loading device 11, a process chamber 21 such as a furnace, and a transport speed monitoring device 100. The loading device 11 transports a boat 31 of wafers into and out of the process chamber 21 in which the wafers are processed. As depicted, the transport speed monitoring device 100 is coupled to a driver 110 of the loading device 11 by which the loaded wafer boat 31 is driven. The monitoring device 100 is responsible for detecting the movement of the wafer boat 31 and asserting an abnormality signal when the transport speed of the wafer boat 31 falls beyond a limit. With reference now to FIG. 2, a flowchart for semiconductor processing according to an embodiment of the invention is illustrated. In step S210, wafers to be processed are first loaded onto the wafer boat 31. Next, in step S220, the loading device 11 transports the wafer boat 31 to the process chamber 21. Meanwhile, a transport speed monitoring procedure is performed in step S230. The monitoring procedure comprises: detecting the movement of the wafer boat 31 and asserting an abnormality signal when the speed of the wafer boat falls beyond a limit. In step S232, the abnormality signal is checked to see whether it is asserted during the transportation. If so, in step S240, the wafer boat 31 is inserted into the chamber 21 in which the wafers can be thus processed within a satisfactory time. Otherwise, in step S234, an emergency procedure is launched in response to the assertion of the abnormality signal. In one embodiment, the emergency procedure may include alerting operators or emergency power shutdown. After processing, the loading device 11 transports the wafer boat 31 out of the chamber 21 in step S250. Similarly, the monitoring procedure of step S230 is performed again. Once the abnormality signal is asserted, the emergency procedure is launched to protect the partially processed wafers.

Figure 3:
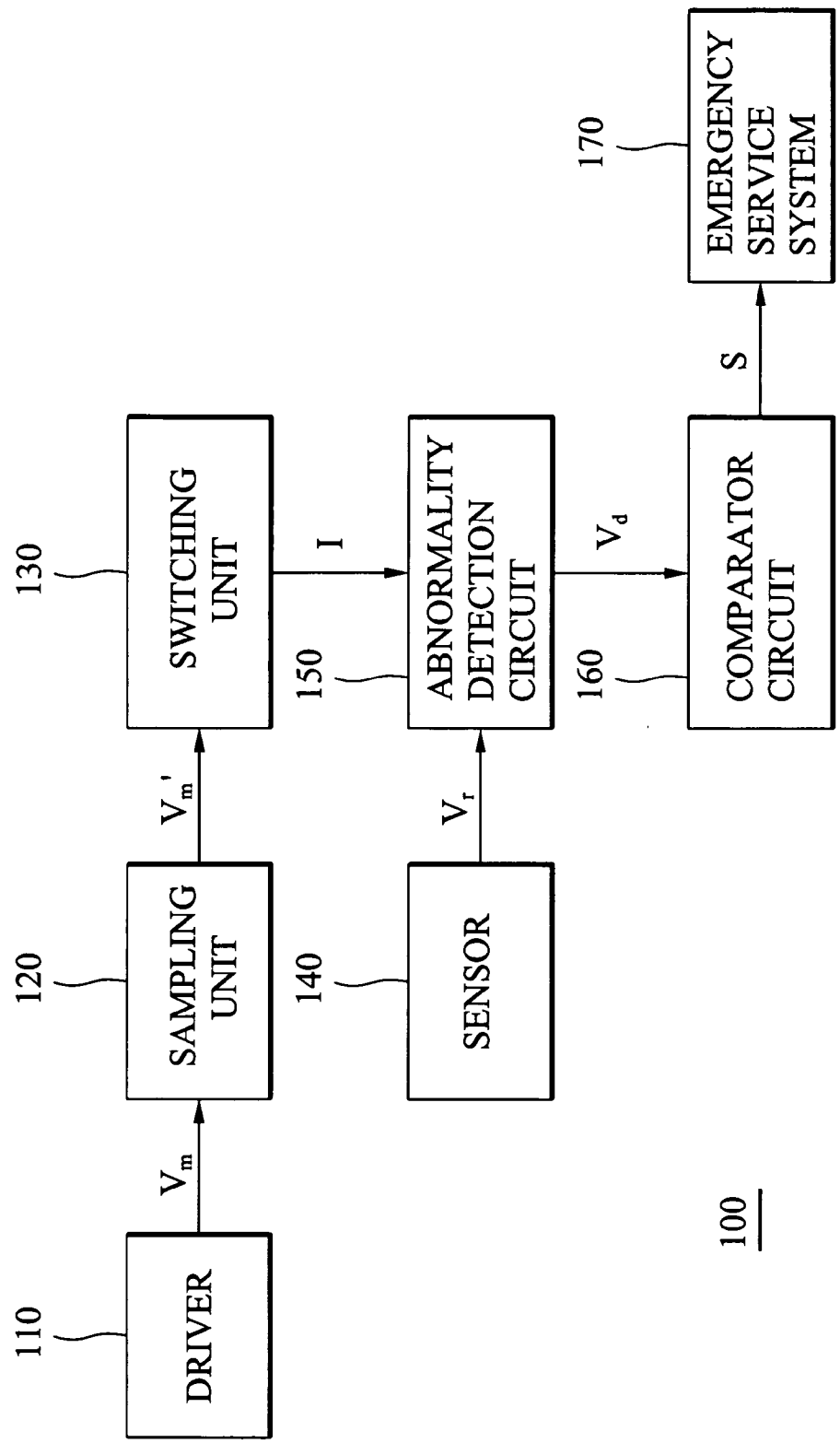
FIG. 3 is a block diagram illustrating a transport speed monitoring apparatus of FIG. 1 according to an embodiment of the invention.

FIG. 3 is a block diagram of the transport speed monitoring apparatus 100 according to an embodiment of the invention. A wafer boat loading system incorporating the apparatus 100 monitors the speed of a loaded wafer boat conveyed to and from a semiconductor furnace, for example. The wafer boat is driven by a DC motor or servo motor, i.e. the driver identified by reference numeral 110 in FIG. 3. The transport speed monitoring apparatus 100 comprises a sensor 140 to detect the movement of the wafer boat and thereby generate an input signal, $V_r$, having a frequency proportional to the speed of the boat. The sensor 140 comprises, but is not limited to, an array of CCD sensors or the like to detect the speed of a moving article and convert the detection to an electrical signal. As shown in FIG. 3, a sampling unit 120 is coupled to the driver 120. In operation, the sampling unit 120 acquires a voltage signal, $V_m$, from the driver 140 and then amplifies the signal $V_m$. The amplified voltage signal, $V_m'$, is applied to a switching unit 130. Coupled between the sampling unit 120 and an abnormality detection unit 150, the switching unit 130 is activated in response to the presence of the amplified voltage signal $V_m'$, allowing a current I to be fed to the abnormality detection unit 150. In the meantime, the abnormality detection circuit 150 receives the input signal $V_r$ from the sensor 140. Once the frequency of the input signal falls outside of a predefined range, the abnormality detection circuit 150 can generate a detection voltage, $V_d$, above a predetermined threshold voltage. To determine if the wafer boat is over speed or under speed, a comparator circuit 160 coupled to the abnormality detection circuit 150 compares the detection voltage $V_d$ with the predetermined threshold voltage. An abnormality signal, S, the output of the comparator circuit 160, is asserted when the detection voltage $V_d$ exceeds the predetermined threshold voltage. An emergency service system 170 responsive to the assertion of the abnormality signal S launches procedures to ensure the safety of the costly in-process wafers. For example, these procedures may include alerting operators or even emergency power shutdown. However, this is merely an example of an emergency service system and embodiments of the present invention are not limited in this respect.

Figure 4:
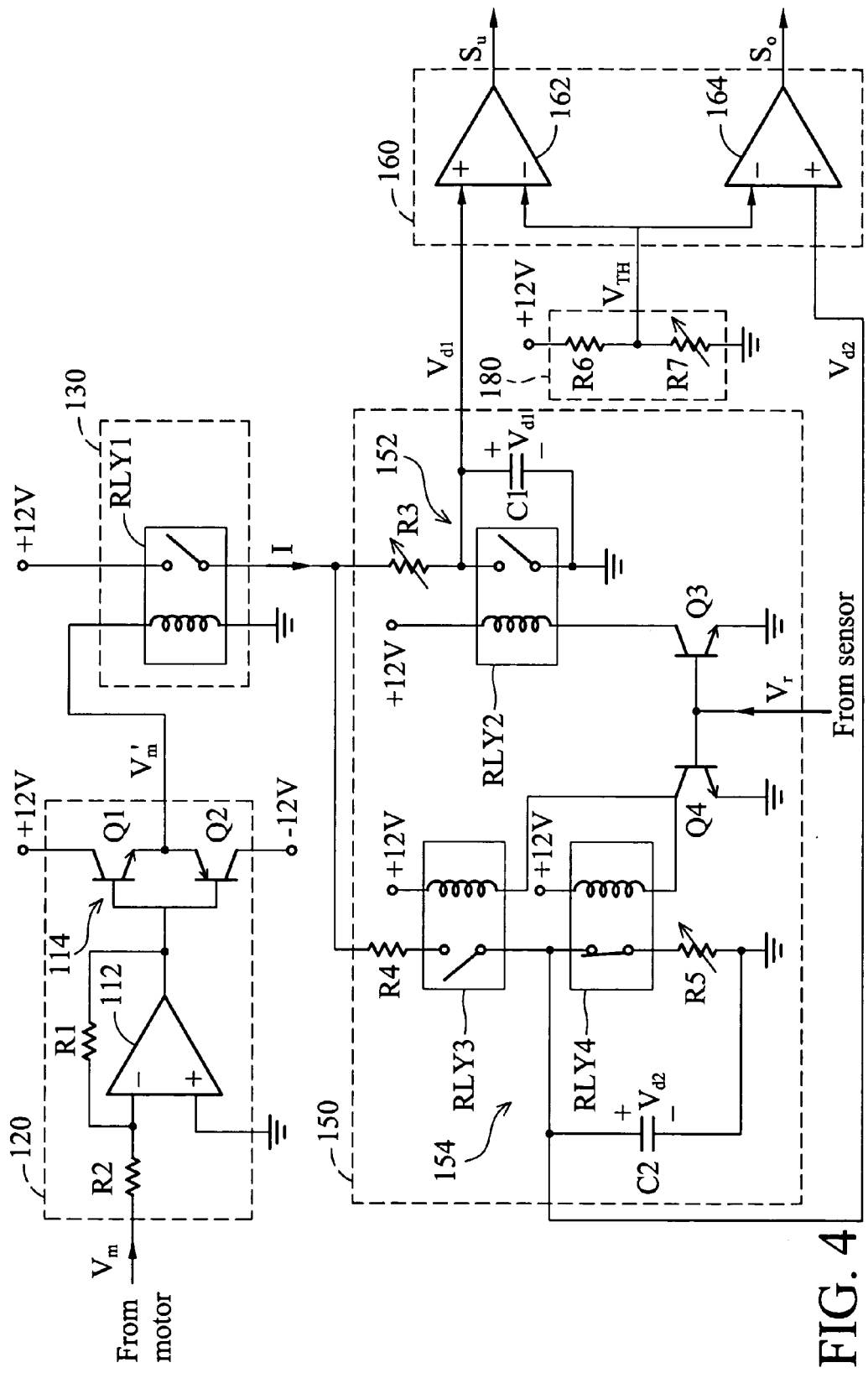
FIG. 4 is a schematic diagram of the transport speed monitoring apparatus according to an embodiment of the invention.

The transport speed monitoring apparatus of the present invention is now described in detail with reference to FIG. 4 when taken in conjunction with FIGS. 5A and 5B. As shown in FIG. 4, the sampling unit 120 comprises an operational amplifier (hereinafter abbreviated as OPA) 112 with negative feedback and a class B push-pull amplifier 114. Note that a resistor R1 is connected from the output terminal of the OPA 112 back to the inverting input terminal thereof and a resistor R2 is connected between the inverting input terminal and a signal source, $V_m$. Moreover, the noninverting input terminal of the OPA 112 is grounded. In one embodiment, the class B push-pull amplifier 114 comprises transistors Q1 and Q2. The transistor Q1's collector is connected to a positive power supply, +12V, while the transistor Q2's collector is connected to a negative power supply, −12V. The bases of the transistors Q1 and Q2 are connected together to the output terminal of the OPA 112. The emitter of the transistor Q1 is connected to the emitter of the transistor Q2, at which the amplifier 114 renders the amplified voltage signal $V_m'$. However, this is merely an example of a sampling unit and embodiments of the present invention are not limited in this respect. In one embodiment, the switching unit 130 is a normally-open relay, identified by alphanumeric symbol RLY1 in FIG. 4. It is known in the art that energizing a relay can close its normally-open relay contacts, but open its normally-closed relay contacts. Therefore, the presence of $V_m'$ energizes the relay RLY1 and this closes the normally-open relay contact, feeding the current I to the abnormality detection circuit 150. This in turn starts the abnormality detection circuit 150.

With continued reference to FIG. 4, the abnormality detection circuit 150 includes an under-speed detection unit 152 and an over-speed detection unit 154. The under-speed detection unit 152 comprises a normally-open relay and an RC circuit having a predetermined time constant. The normally open-relay RLY2 is controlled, through a transistor Q3, by the input signal $V_r$ from the sensor 140. The RC circuit includes a resistor R3 and a capacitor C1 operatively coupled to the relay RLY2, which charges a first detection voltage $V_{d1}$ across the capacitor C1 when the relay RLY2 is deactivated (de-energized), and discharges the voltage $V_{d1}$ when the relay RLY2 is activated (energized). Additionally, the over-speed detection unit 154 comprises a normally-open relay, a normally-closed relay, and an RC circuit having another predetermined time constant. The normally open relay RLY3 and the normally closed relay RLY4 are both controlled, through a transistor Q4, by the input signal $V_r$ from the sensor 140. The RC circuit comprises a resistor R4 operatively coupled to the relay RLY3, as well as a resistor R5 and a capacitor C2 operatively coupled to the relay RLY4. When the relays RLY3 and RLY4 are both activated (energized), a second detection voltage $V_{d2}$ across the capacitor C2 is charged through the RC circuit; when the relays RLY3 and RLY4 are both deactivated (de-energized), the voltage $V_{d2}$ is discharged through the RC circuit. As to the comparator circuit 160, two comparators 162 and 164 are involved. The comparator 162 coupled to the under-speed detection unit 152 compares the detection voltage $V_{d1}$ with the predetermined threshold voltage $V_{TH}$. The comparator 164 coupled to the over-speed detection unit 154 compares the detection voltage $V_{d2}$ with the predetermined threshold voltage $V_{TH}$. The output signals of the comparators 162 and 164 are transmitted to the emergency service system 170 of FIG. 3. Furthermore, the transport speed monitoring apparatus comprises a voltage divider 180 to provide the predetermined threshold voltage $V_{TH}$. The voltage divider 180 comprises resistors R6 and R7, for example. In one embodiment, the resistors R3, R5 and R7 are adjustable so that the time constants and the threshold voltage can be regulated.

Figure 5A:
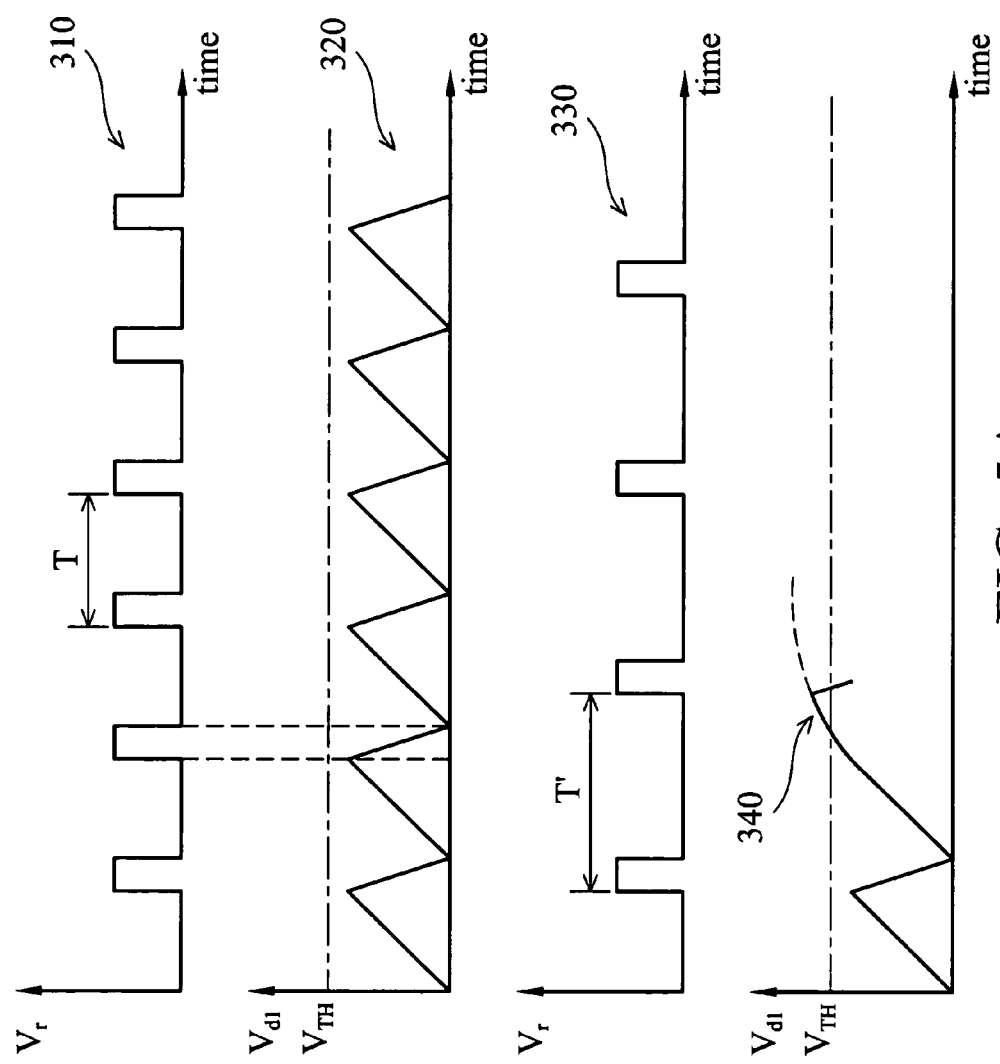
FIGS. 5A and 5B are graphical illustrations of the operation of the transport speed monitoring apparatus.
Figure 5B:
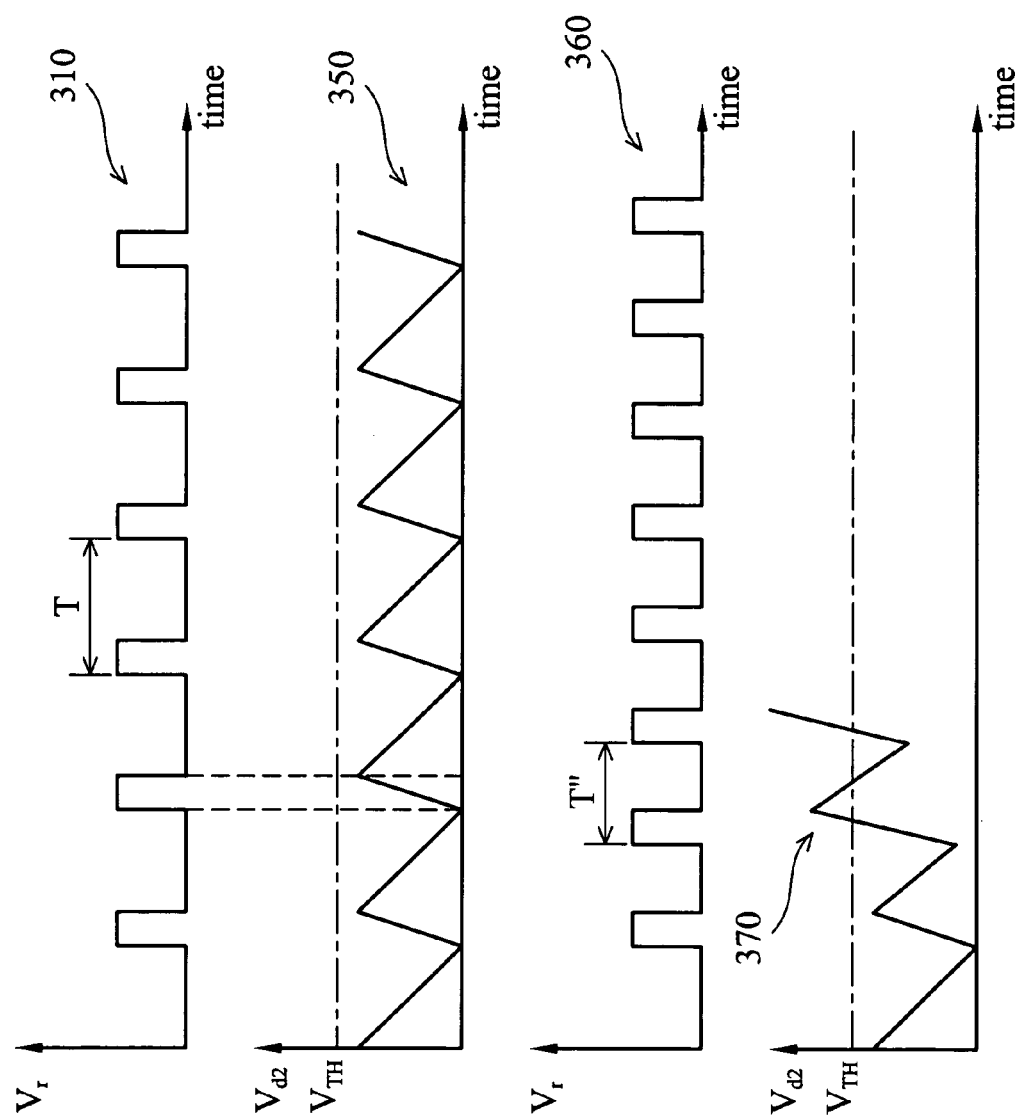

FIGS. 5A and 5B show waveforms of $V_r$, $V_{d1}$ and $V_{d2}$ in different conditions, useful in understanding the transport speed monitoring apparatus. The waveform 310 in FIGS. 5A and 5B represents the input signal $V_r$, indicating the speed of a detected article (wafer boat) within an allowable range. The period of the waveform 310 is T, i.e. the frequency proportional to the speed of the wafer boat being transported is 1/T. In a high state of the input signal $V_r$, the transistors Q3 and Q4 are turned on, causing the relays RLY2, RLY3 and RLY3 to be energized, which in turn results in discharging of the voltages $V_{d1}$ across the capacitor C1 and charging of the voltages $V_{d2}$ across the capacitor C2. In a low state of the input signal $V_r$, the transistors Q3 and Q4 are turned off, causing the relays RLY2, RLY3 and RLY3 to be de-energized, which in turn results in charging of the voltages $V_{d1}$ across the capacitor C1 and discharging of the voltages $V_{d2}$ across the capacitor C2. The waveforms 320 and 350 represent the detection voltages $V_{d1}$ and $V_{d2}$, respectively, in accordance with the waveform 310. It can be seen that the detection voltages $V_{d1}$ and $V_{d2}$ do not exceed the predetermined threshold voltage $V_{TH}$ if the speed of the wafer boat is managed within the allowable range. The period of the input signal $V_r$ increases as the detected article (wafer boat) slows. In FIG. 5A, the waveform 330 represents the input signal $V_r$ having a frequency of 1/T' below a lower limit of the allowable range. The waveform 340 represents the detection voltages $V_{d1}$ in accordance with the waveform 330. In this case, the relay RLY2 is de-energized for an excessive time, causing the RC circuit to charge the detection voltages $V_{d1}$ above the predetermined threshold voltage $V_{TH}$. Thus, an under-speed signal, $S_u$, is asserted by the comparator 162. On the other hand, the period of the input signal $V_r$ decreases as the detected article (wafer boat) speeds up. In FIG. 5B, the waveform 360 represents the input signal $V_r$ having a frequency of 1/T'' above an upper limit of the allowable range. The waveform 370 represents the detection voltages $V_{d2}$ in accordance with the waveform 360. It can be seen that the relays RLY3 and RLY4 are de-energized for an unsatisfactory time. This causes the RC circuit to discharge the detection voltages $V_{d2}$ insufficiently, leading to charge accumulation on the capacitor C2. As a result, the detection voltage $V_{d2}$ rises above the predetermined threshold voltage $V_{TH}$ and an over-speed signal, $S_o$, is asserted by the comparator 164.

In view of the above, the present invention provides a semiconductor processing system and method capable of ensuring that wafers are processed within a satisfactory time by monitoring the transport speed of a wafer boat. The present invention further provides a real-time apparatus for monitoring the speed of a loaded wafer boat transport to and from a semiconductor processing furnace. The use of the apparatus effectively protects costly in-process wafers from damage by abnormalities including under-speed and over-speed problems.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A wafer boat loading system utilizing a transport speed monitoring apparatus by which the speed of a wafer boat conveyed to and from a furnace is monitored and in which the wafer boat is driven by a driver, the transport speed monitoring apparatus comprising:

a sensor detecting the movement of the wafer boat and generating an input signal having a frequency proportional to the speed of the wafer boat;

an under-speed detection unit coupled to the sensor to receive the input signal, generating a first detection voltage exceeding a predetermined threshold voltage when the frequency of the input signal is below a lower limit;

an over-speed detection unit coupled to the sensor to receive the input signal, generating a second detection voltage exceeding the predetermined threshold voltage when the frequency of the input signal exceeds an upper limit;

a first comparator coupled to the under-speed detection unit, comparing the first detection voltage with the predetermined threshold voltage, and asserting an under-speed signal when the first detection voltage exceeds the predetermined threshold voltage;

a second comparator coupled to the over-speed detection unit, comparing the second detection voltage with the predetermined threshold voltage, and asserting an over-speed signal when the second detection voltage exceeds the predetermined threshold voltage;

a sampling unit coupled to the driver, acquiring and amplifying a voltage signal therefrom; and a switching unit coupled between the sampling unit and the under-speed detection unit as well as between the sampling unit and the over-speed detection unit, activated in response to the presence of the amplified voltage signal and thus starting the under-speed detection and the over-speed detection units.

2. The apparatus of claim 1 wherein the under-speed detection unit comprises:

a normally-open relay under control of the input signal from the sensor; and an RC circuit including a resistor and a capacitor operatively coupled to the normally open relay, which charges the first detection voltage across the capacitor when the normally-open relay is deactivated, and discharges the first detection voltage across the capacitor when the normally-open relay is activated.

3. The apparatus of claim 1 wherein the over-speed detection unit comprises:

a normally-open relay and a normally-closed relay, both under control of the input signal from the sensor; and an RC circuit including a resistor operatively coupled to the normally-open relay and a capacitor operatively coupled to the normally-closed relay, which charges the second detection voltage across the capacitor when the normally-open and the normally-closed relays are activated, and discharges the second detection voltage across the capacitor when the normally open and the normally closed relays are deactivated.

* * * * *